(12) United States Patent
Iwasaki et al.

(10) Patent No.: US 6,509,206 B2
(45) Date of Patent: Jan. 21, 2003

(54) METHOD AND APPARATUS FOR MANUFACTURING SEMICONDUCTOR DEVICE, AND SEMICONDUCTOR DEVICE MANUFACTURED BY THE METHOD

(75) Inventors: Toshihiro Iwasaki, Tokyo (JP); Satoshi Yamada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 37 days.

(21) Appl. No.: 09/828,942

(22) Filed: Apr. 10, 2001

(65) Prior Publication Data

US 2002/0070459 A1 Jun. 13, 2002

(30) Foreign Application Priority Data

Dec. 11, 2000 (JP) ........................................ 2000-375979

(51) Int. Cl.$^7$ ................................................ H01L 21/44
(52) U.S. Cl. ........................................ 438/107; 438/455
(58) Field of Search ................................ 438/106, 107, 438/108, 118, 120, 455

(56) References Cited

U.S. PATENT DOCUMENTS 6,269,999 B1 * 8/2002 Okazaki et al. .......... 228/110.1

FOREIGN PATENT DOCUMENTS

JP 6-268027 9/1994
JP 10-12669 1/1998

\* cited by examiner

Primary Examiner—John F. Niebling
Assistant Examiner—Christopher Lattin
(74) Attorney, Agent, or Firm—McDermott, Will & Emery

(57) ABSTRACT

In connection with a method of manufacturing a semiconductor device including a step of establishing electrical connection between terminal electrodes of a circuit board and electrode pads of a semiconductor substrate by means of ultrasonic vibration, prevention of flaws stemming from ultrasonic vibration is aimed. A semiconductor substrate is mounted on the surface of an insulation circuit board such that terminal electrodes of the insulation circuit board oppose electrode pads of a semiconductor board. Desired electrical connection is established by means of applying ultrasonic vibration between a first holding tool for holding the insulation circuit board and a second holding tool for holding the semiconductor substrate. Ultrasonic vibration is applied while intermediate material of lower hardness is interposed between the first holding tool and the insulation circuit board and while another intermediate material of lower hardness is interposed between the second holding tool and the insulation circuit board.

14 Claims, 5 Drawing Sheets

METHOD AND APPARATUS FOR MANUFACTURING SEMICONDUCTOR DEVICE, AND SEMICONDUCTOR DEVICE MANUFACTURED BY THE METHOD

BACKGROUND OF THE INVENTION

1. Field of the Invention

The present invention relates to a method and apparatus for manufacturing a semiconductor device and to a semiconductor device manufactured by the method. Particularly, the present invention relates to a method of manufacturing a semiconductor device including a step of establishing electrical connection between terminal electrodes of a circuit board and electrode pads of a semiconductor substrate by means of ultrasonic vibration, to an apparatus for manufacturing a semiconductor device employing the method, and to a semiconductor device manufactured by the method.

2. Description of the Background Art

Methods of forming a semiconductor device by means of placing a semiconductor substrate on an insulation circuit board have already been known. FIG. 9 is a cross-sectional view for describing one example of such a manufacturing method. According to the manufacturing method shown in FIG. 9, a semiconductor substrate 14 is set on an insulation circuit board 10 such that terminal electrodes 12 of the insulation circuit board 10 oppose electrode pads 16 provided on the semiconductor substrate 14. Connection conductors 18 are bonded to the respective electrode pads 16 of the semiconductor substrate 14 beforehand.

Load is imposed so as to press together a first holding tool 20 for holding the insulation circuit board 10 and a second holding tool 22 for holding the semiconductor substrate 14. Ultrasonic vibration is applied between the first and second holding tools 20 and 22. Consequently, the connection conductors 18 and the terminal electrodes 12 are joined together, thus establishing electrical connection between the terminal electrodes 12 and the electrode pads 16.

Under the conventional method, material of high hardness, such as carbide steel or ceramic, is used for the tool 20 for holding the insulation circuit board 10 and for the tool 22 for holding the semiconductor substrate 14. For this reason, a problem arises such as generation of scratches on the surface of the semiconductor substrate 14 to be mounted by use of the conventional method when ultrasonic vibration is applied to the substrate 14. Such a problem is expected to become more noticeable with an increase in the number or size of semiconductor chips.

SUMMARY OF THE INVENTION

The present invention has been conceived to solve such a drawback of the conventional method and is aimed at providing a method of manufacturing a semiconductor device which prevents scratches stemming from ultrasonic vibration, by means of interposing intermediate material of appropriate hardness between a circuit board and a holding tool for holding the circuit board, as well as between a semiconductor substrate and a holding tool for holding the semiconductor substrate.

A second object of the present invention is to provide an apparatus for manufacturing a semiconductor device employing the method.

A third object of the present invention is to provide a semiconductor device manufactured by the method.

The above objects of the present invention are achieved by a method of manufacturing a semiconductor device having a semiconductor substrate mounted on a circuit board. In the method, the semiconductor substrate is mounted on the surface of the circuit board such that terminal electrodes of the circuit board oppose electrode pads of the semiconductor substrate. Electrical connection is established between the terminal electrodes and the electrode pads, by means of applying ultrasonic vibration between a first holding tool for holding the circuit board and a second holding tool for holding the semiconductor substrate. The method further includes at least one of following steps. A step in which intermediate material is interposed between the first holding tool and the circuit board such that the intermediate material adheres to at least one of the first holding tool and the circuit board. A step in which intermediate material is interposed between the second holding tool and the semiconductor substrate such that the intermediate material adheres to at least one of the second holding tool and the semiconductor substrate. The intermediate material interposed between the first holding tool and the circuit board has hardness lower than that of the circuit board. The intermediate material interposed between the second holding tool and the semiconductor substrate has hardness lower than that of the semiconductor substrate.

The above objects of the present invention are achieved by a semiconductor device manufactured by the manufacturing method described above.

The above objects of the present invention are achieved by an apparatus for manufacturing a semiconductor device having a semiconductor substrate mounted on a circuit board. The apparatus includes a first holding tool for holding the circuit board as well as a second holding tool for holding the semiconductor substrate. The apparatus also include a transfer mechanism for transferring the circuit board and the semiconductor substrate between the first and second holding tools such that terminal electrodes of the circuit board oppose electrode pads of the semiconductor substrate. The apparatus further includes a vibration imparting mechanism for imparting ultrasonic vibration between the first holding tool for holding the circuit board and the second holding tool for holding the semiconductor substrate. At least one of intermediate material supply units described below is provided. An intermediate material supply unit for supplying between the first holding tool and the circuit board tape-shaped intermediate material having hardness lower than that of the circuit board. An intermediate material supply unit for supplying between the second holding tool and the semiconductor substrate tape-shaped intermediate material having hardness lower than that of the semiconductor substrate.

Other objects and further features of the present invention will be apparent from the following detailed description when read in conjunction with the accompanying drawings.

DESCRIPTION OF THE PREFERRED EMBODIMENTS

First Embodiment

A first embodiment of the present invention will be described by reference to FIGS. 1A through 1E and FIG. 2.

FIGS. 1A through 1E are cross-sectional views for describing details of a round of processing to be performed under a manufacturing method according to the first embodiment.

Figure 1A:
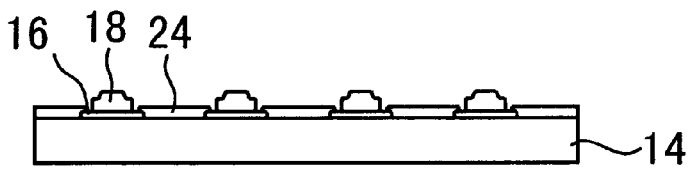
FIGS. 1A through 1E and FIG. 2 are cross-sectional views for describing a manufacturing method according to a first embodiment of the present invention.

As shown in FIG. 1A, electrode pads 16 and an insulation film 24 are formed on the surface of a semiconductor substrate 14. On the respective electrode pads 16 are formed connection conductors 18.

Figure 1B:
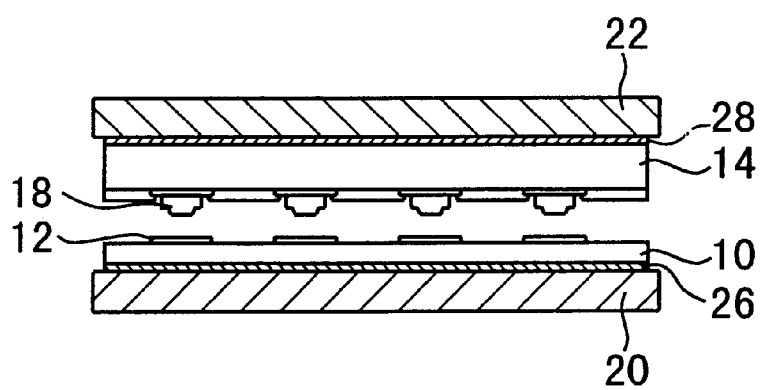
Figure 1C:
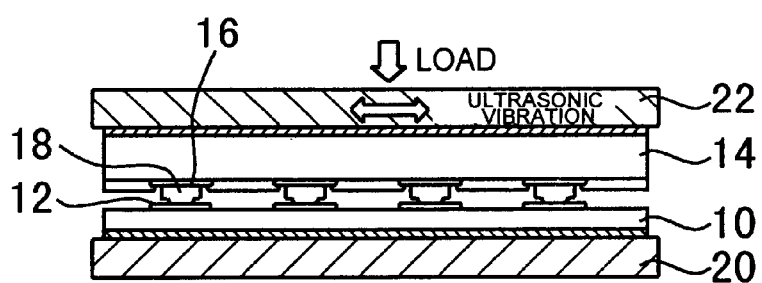
Figure 1D:
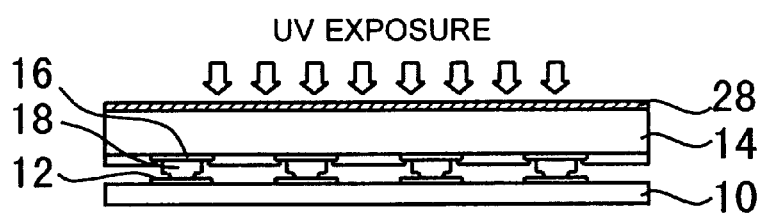
Figure 1E:
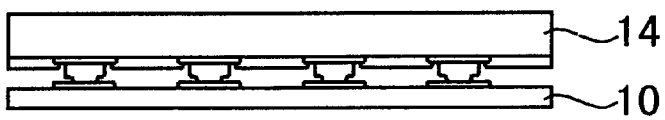

The semiconductor substrate 14 is placed on the insulation circuit board 10 such that the connection conductors 18 oppose terminal electrodes 12 (see FIG. 1B). In this stage, the insulation circuit board 10 is held by a first holding tool 20. The first holding tool 20 is formed from material of high hardness, such as carbide steel or ceramic.

A sheet-like intermediate material 26 is interposed between the first holding tool 20 and the insulation circuit board 10. The intermediate material 26 is formed from material which is lower in hardness than the insulation circuit board 10. In the present embodiment, the intermediate material 26 is fixed on the surface of the first holding tool 20 by means of glue. The intermediate material 26 is not necessarily fixed to the first holding tool 20 by glue; so long as there can be prevented flying away of the intermediate material 26 during manufacturing processes, the intermediate material 26 may be affixed to the first holding tool 20 by means of adhesive force or electrostatic force.

Figure 2:
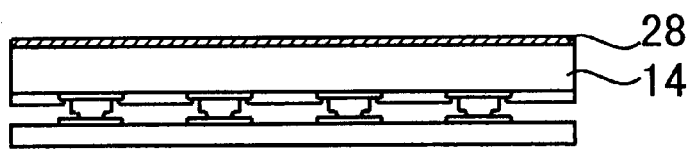

The semiconductor substrate 14 is held by a second holding tool 22. Like the first holding tool 20, the second holding tool 22 is formed from material of high hardness, such as carbide steel or ceramic. Sheet-like intermediate material 28 is interposed between the second holding tool 22 and the semiconductor substrate 14. The intermediate material 28is formed from material of lower hardness than the semiconductor substrate 14. As shown in FIG. 2, the intermediate material 28 is bonded to the surface of the semiconductor substrate 14 by means of glue. The intermediate material 28 is not necessarily fixed to the semiconductor substrate 14; so long as there can be prevented flying away of the intermediate material 26 during manufacturing processes, the intermediate material 28 may be affixed to the semiconductor substrate 14 by means of adhesive force. While a predetermined load is applied to the first holding tool 20 and the second holding tool 22, ultrasonic vibration is applied across the first and second holding tools 20 and 22. Consequently, the connection conductors 18 and the terminal electrodes 12 are joined together, and electrical connection is ensured between the electrode pads 16 and the terminal electrodes 12 (see FIG. 1C).

In the present embodiment, the intermediate material 28 is bonded to the semiconductor substrate 14 by means of glue which softens upon exposure to UV radiation. Accordingly, after the connection conductors 18 and the terminal electrodes 12 have been joined, the semiconductor substrate 14 is exposed to UV rays. As a result, the intermediate material 28 can be readily removed from the semiconductor substrate 14 without inflicting damage to the thus-joined sections (see FIGS. 1D and 1E).

As mentioned above, in the present embodiment, the intermediate material 26 is interposed between the first holding tool 20 and the insulation circuit board 10, and the intermediate material 28 is interposed between the second holding tool 22 and the semiconductor substrate 14. The intermediate material 26 is lower in hardness than the insulation circuit board 10, and the intermediate material 28 is lower in hardness than the semiconductor substrate 14. Hence, in the present embodiment, there can be effectively prevented generation of scratches in the semiconductor substrate 14 and the insulation circuit board 10, which would otherwise be caused by application of the ultrasonic vibration.

In the present embodiment, as a result of application of load onto the insulation circuit board 10 and the semiconductor substrate 14, the insulation circuit board 10 and the semiconductor substrate 14 are subjected to ultrasonic vibration under a circumstance in which the circuit board 10 and the substrate 14 are slightly embedded in the intermediate material 26 or 28, respectively. Under the circumstance, in contrast with a case where the intermediate materials 26 and 28 are not employed, application of ultrasonic vibration induces great frictional resistance between the insulation circuit board 10 and the first holding tool 20 as well as between the semiconductor substrate 14 and the second holding tool 2. Thus, the ultrasonic vibration efficiently propagates between the connection conductors 18 and the terminal electrodes 12. In a case where the present embodiment is used, desired electrical connection can be established more efficiently than in a case where the intermediate materials 26 and 28 are not employed.

In the present embodiment, since the intermediate material 28 is fixed on the semiconductor substrate 14, a new intermediate material 28 can be used for every semiconductor substrate 14. For this reason, the quality of the intermediate material 28 is stabilized, and processes for mounting the semiconductor substrate 14 are also stabilized, thereby enabling manufacture of semiconductor devices of stable quality.

In the first embodiment, the intermediate material 28 is removed from the surface of the semiconductor substrate 14. However, the present invention is not limited to this embodiment. More specifically, the intermediate material 28 may be left on the surface of the semiconductor substrate 14, as required.

Second Embodiment

Referring FIGS. 3A through 3D and FIG. 4, a second embodiment of the present invention will be described. In FIGS. 3A through 3D and FIG. 4, those elements which are identical with the elements shown in FIGS. 1A through 1E and FIG. 2 are assigned the same reference numerals, and repetition of their explanations is omitted.

FIGS. 3A through 3D are cross-sectional views for describing details of a round of processing to be performed under a manufacturing method according to the second embodiment.

Figure 3A:
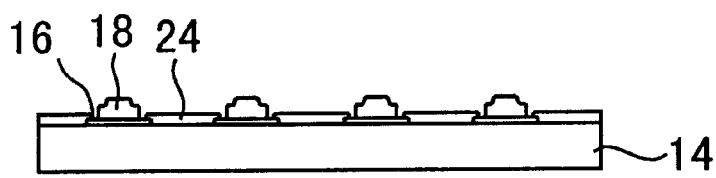
FIGS. 3A through 3D and FIG. 4 are cross-sectional views for describing a manufacturing method according to a second embodiment of the present invention.
Figure 3B:
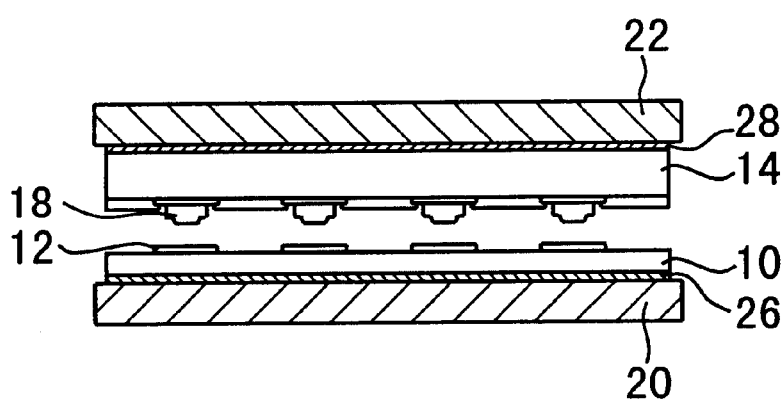
Figure 3C:
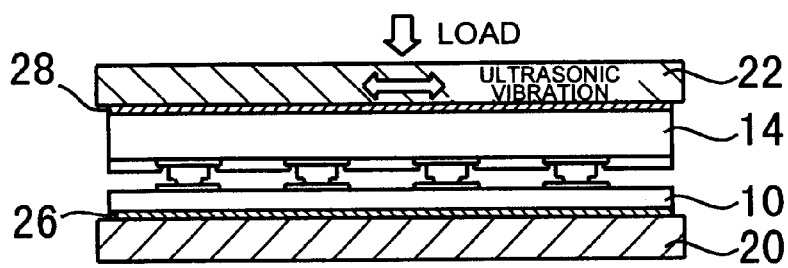
Figure 3D:
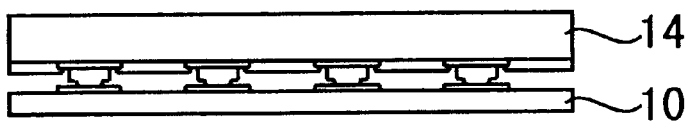

As in the case of the first embodiment, under the manufacturing method according to the present embodiment, the connection conductors 18 are formed on the respective electrode pads 16 of the semiconductor substrate 14 (FIG. 3A). The semiconductor substrate 14 is placed on the insulation circuit board 10 such that the connection conductors 18 oppose terminal electrodes 12 (see FIG. 3B). Subsequently, while a predetermined load is applied to the first holding tool 20 and the second holding tool 22, ultrasonic vibration is applied across the first and second holding tools 20 and 22, whereby electrical connection is ensured between the electrode pads 16 and the terminal electrodes 12 (see FIG. 3C).

In the present embodiment, as in the case of the first embodiment, ultrasonic vibration is applied to the insulation circuit board 10 and the semiconductor substrate 14, while the intermediate material 26 is interposed between the first holding tool 20 and the insulation circuit board 10 as well as the intermediate material 28 is interposed between the second holding tool 22 and the semiconductor substrate 14. Accordingly, as in the case of the first embodiment, the manufacturing method according to the present embodiment effectively prevents generation of scratches in the semiconductor substrate 14 and the insulation circuit board 10, thereby enabling efficient joining the connection conductors 18 and the terminal electrodes 12.

Figure 4:
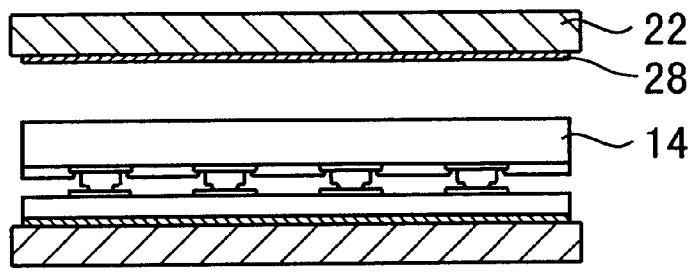

As shown in FIG. 4, in the present embodiment, the intermediate material 28 has a selective adhesive property which renders the intermediate material 28 to adhere to only the second holding tool 22 rather than to the semiconductor substrate 14. In the present embodiment, there is no necessity of producing force for peeling the intermediate material 28 from the semiconductor substrate 14; that is, force for peeling the semiconductor substrate 14 from the insulation circuit board 10, during the course of manufacture of a semiconductor device. Hence, damage inflicted on joined sections between the connection conductors 18 and the terminal electrodes 12 can be made less severe than that inflicted in the first embodiment.

It is be noted that the intermediate material 28 may be fixed on the second holding tool 22 by means of a holder or glue. Alternatively, the intermediate material 28 may be affixed to the second holding tool 22 by means of adhesive force or electrostatic force.

Third Embodiment

Figure 5:
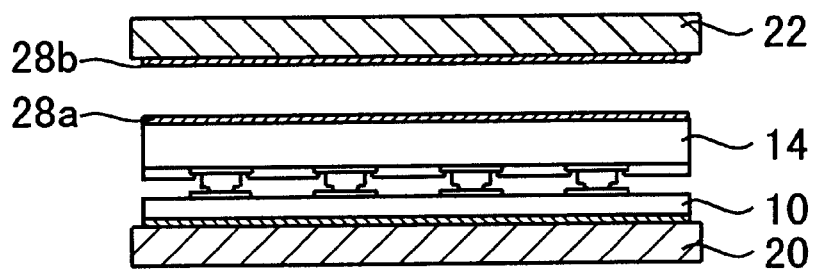
FIG. 5 is a cross-sectional view for describing a manufacturing method according to a third and fourth embodiment of the present invention.

A third embodiment of the present invention will be described by reference to FIG. 5. FIG. 5 is a cross-sectional view for describing a characteristic portion of a manufacturing method according to the third embodiment. The manufacturing method according to the present embodiment is identical with the first or second embodiment, except that two intermediate-material layers 28a and 28b are interposed between the semiconductor substrate 14 and the second holding tool 22.

According to the manufacturing method of the present embodiment, the selective adhesiveness of the intermediate material to be interposed between the semiconductor substrate 14 and the second holding tool 22 can be controlled with a high degree of freedom. For example, FIG. 5 illustrates an example in which the intermediate-material layer 28a exhibits selective adhesiveness so as to adhere to the semiconductor substrate 14 and in which the intermediate-material layer 28b exhibits selective adhesiveness so as to adhere to the second holding tool 22. The present embodiment enables an increase in the degree of freedom of manufacturing process as compared with the first or second embodiment.

Fourth Embodiment

Turning again to FIG. 5, a fourth embodiment of the present invention will be described. A manufacturing method according to the present embodiment is characterized in that gel or liquid intermediate materials 28a and 28b are used between the semiconductor substrate 14 and the second holding tool 22. In this embodiment, the intermediate materials 28a and 28b shown in FIG. 5 are of the same composition, expressing a layer adhering to the semiconductor substrate 14 and a layer adhering to the second holding tool 22, respectively.

Gel or liquid type material is more suitable than sheet-like type material for rendering a periodic supply of the intermediate material 28a and 28b to be easy. Further, the gel or liquid intermediate material can be removed more readily than can a sheet-like intermediate material, by means of cleaning. The manufacturing method according to the present embodiment enables an increase in productivity of the semiconductor device as compared with the manufacturing method using sheet-like intermediate material.

In the present embodiment, gel or liquid intermediate material is used for only the semiconductor substrate 14 side. However, the present invention is not limited to the embodiment. In other words, gel or liquid intermediate material may be used for the insulation circuit board 10 side instead for the semiconductor substrate 14 side, or maybe used for the insulation circuit board 10 side as well as for the semiconductor substrate 14 side.

Fifth Embodiment

Figure 6:
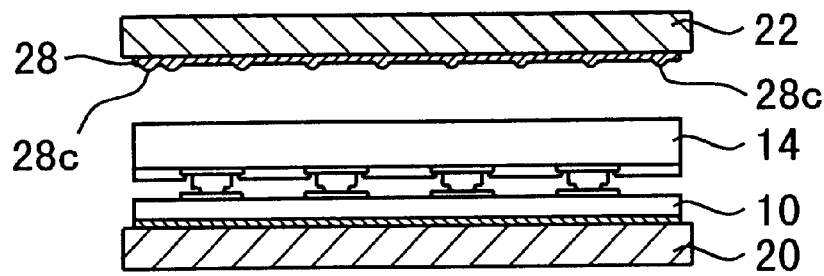
FIG. 6 is a cross-sectional view for describing a manufacturing method according to a fifth embodiment of the present invention.

Referring to FIG. 6, a fifth embodiment of the present invention will be described. FIG. 6 is a cross-sectional view for describing a characteristic portion of a manufacturing method according to the sixth embodiment. The manufacturing method according to the present embodiment is identical with the second embodiment, except that the intermediate material 28 to be interposed between the semiconductor substrate 14 and the second holding tool 22 has a surface with a flecked effect which is to oppose the semiconductor substrate 14.

In the present embodiment, the intermediate material 28 is a sheet-like member which does not adhere to the semiconductor substrate 14 and has selective adhesiveness so as to adhere to the second holding tool 22. The surface of the intermediate material 28 opposing the semiconductor substrate 14 has a plurality of projections 28c. When the intermediate material 28 according to the present embodiment is brought into contact with the semiconductor substrate 14, the projections 28c induce high frictional resistance against the semiconductor substrate 14. Hence, according to the present embodiment, loss that arises between the semiconductor substrate 14 and the intermediate material 28 during the course of application of ultrasonic vibration can be diminished to a level lower than that which arises in the second embodiment.

Sixth Embodiment

Next will be described a sixth embodiment of the present invention. A manufacturing method according to the present embodiment is characterized in that the intermediate materials 26 and 28 (or 28a and 28b) are formed from material that has sufficient resistance to the heat developing when the connection conductors 18 and the terminal electrodes 12 are joined together. The manufacturing method according to the present embodiment is embodied by means of imparting heat resistance to the intermediate material 26 and 28 (28a and 28b) employed in any of the first through fifth embodiments.

The manufacturing method according to the embodiment enables prevention of a change in the nature of selective adhesiveness of the intermediate material 26 and 28 (28a and 28b) during the course of manufacture of a semiconductor device. For this reason, the present embodiment enables to prevent force for peeling the semiconductor substrate 14 from the insulation circuit board 10 from arising, which would otherwise arise due to the intermediate material 26 and 28 (28a and 28b), thereby stabilizing the quality of a semiconductor device.

Seventh Embodiment

Figure 7:
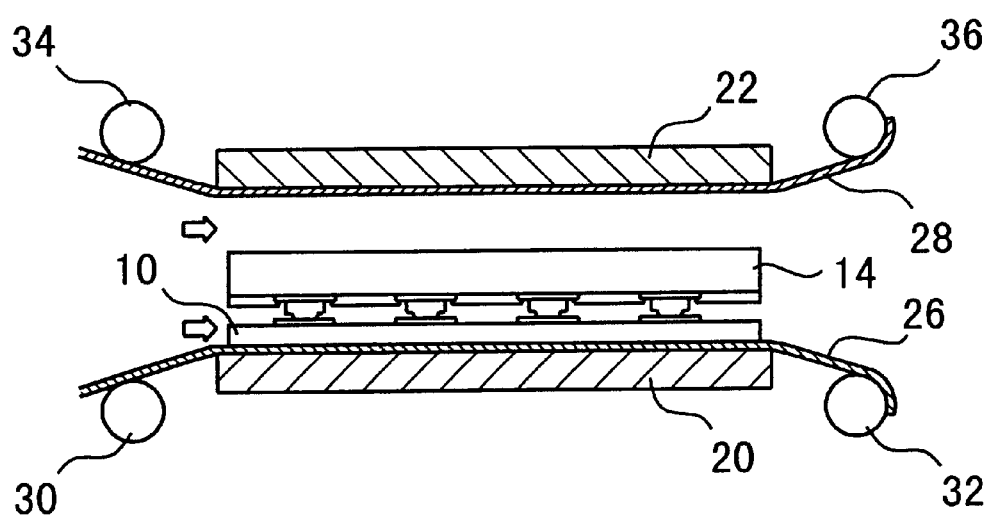
FIG. 7 is a cross-sectional view for describing a manufacturing method according to a seventh embodiment of the present invention.

Referring to FIG. 7, a seventh embodiment of the present invention will be described. As shown in FIG. 7, a manufacturing method according to the present embodiment employs tape-shaped intermediate material 26 and 28 and a manufacturing apparatus having a transfer mechanism for automatically transferring the tape-shaped intermediate material 26 and 28. As shown in FIG. 7, a transfer mechanism for transferring the intermediate material 26 is embodied by combination of a tape feed roller 30 and a tape output roller 32. Further, a transfer mechanism for transferring the intermediate material 26 is embodied by combination of a tape feed roller 34 and a tape output roller 36.

The intermediate material 26 is transferred such that a new portion of the material is inserted into a space between the first holding tool 20 and the insulation circuit board 10 at a timing at which no load is imposed for pressing the insulation circuit 10 against the first holding tool 20. Similarly, the intermediate material 28 is transferred such that a new portion of the material is inserted into a space between the second holding tool 22 and the semiconductor substrate 14 at a timing at which no load is imposed for pressing the semiconductor substrate 14 against the second holding tool 22.

The manufacturing method according to the present embodiment enables implementation of the function of readily exchanging degraded intermediate material 26 and 28 with new material while adopting the construction in which the intermediate material 26 adhere to the first holding tool 20 and the intermediate material 28 adhere to the second holding tool 22. Hence, the manufacturing method according to the present embodiment enables easy manufacture of semiconductor devices of stable quality.

Eighth Embodiment

Figure 8A:
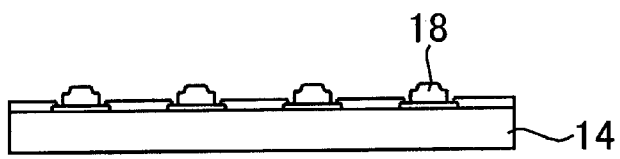
FIG. 8 is a cross-sectional view for describing a manufacturing method according to a eighth embodiment of the present invention.
Figure 8B:
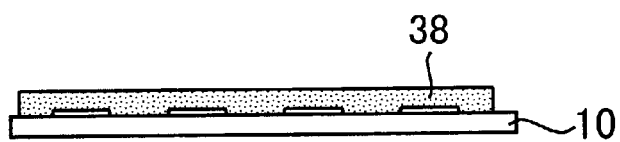
Figure 8C:
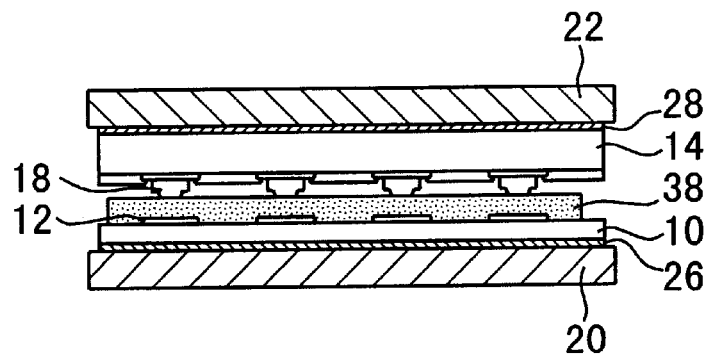
Figure 8D:
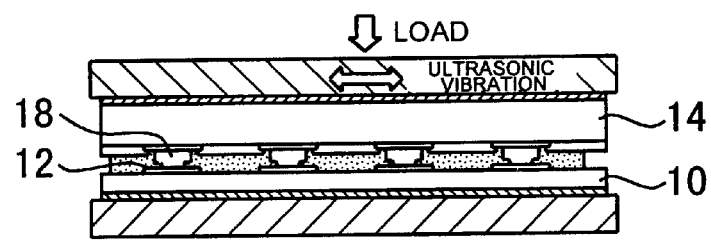

An eighth embodiment of the present invention will be described by reference to FIGS. 8A through 8E. FIGS. 8A through 8E are cross-sectional views for describing details of a round of processing to be performed under a manufacturing method according to the eighth embodiment. In the eighth embodiment, after the connection conductors 18 have been formed on the semiconductor substrate 14 (FIG. 8A), a resin layer 38 is formed on the insulation circuit board 10 (FIG. 8B). Except the above-mentioned processing, the method according to the present embodiment performs processing which is the same as that performed in the first and second embodiments (FIGS. 8C and 8D).

Figure 8E:
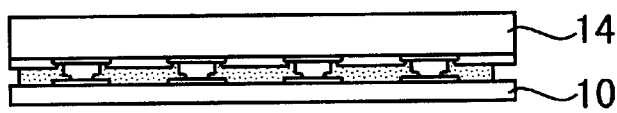
Figure 9:
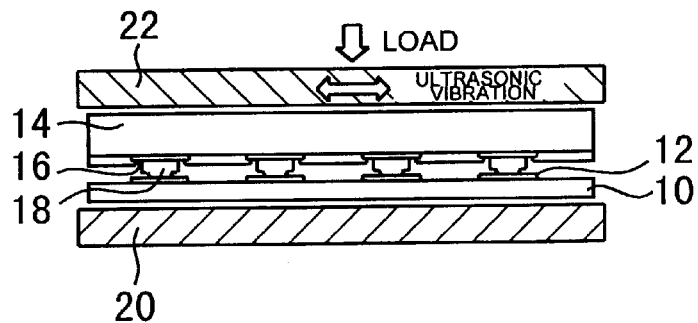
FIG. 9 is a cross-sectional view for describing a conventional manufacturing method of a semiconductor device.

The resin layer 38 is formed from thermosetting resin or UV-setting resin. In a step in which the connection conductors 18 and the terminal electrodes 12 are joined together by means of ultrasonic vibration (see FIG. 8D), the resin layer 38 remains soft. Therefore, regardless of presence of the resin layer 38, the connection conductors 38 and the terminal electrodes 12 are brought into an appropriate joined state, as in the case of the other embodiments. After the connection conductors 18 and the terminal electrodes 12 have been joined, the resin layer 38 is hardened while filling the space between the insulation circuit board 10 and the semiconductor substrate 14 (FIG. 8E).

As mentioned above, the manufacturing method according to the present embodiment enables formation of the resin layer 38 for sealing the connection conductors 18 in the space between the insulation circuit board 10 and the semiconductor substrate 14. In this case, entry of moisture or extraneous substances into the area in the vicinity of the connection conductors 18 is hindered by the resin layer 38, thus embodying a highly-reliable semiconductor device.

The first through eighth embodiments describe the case where the semiconductor substrate 14 is mounted on the insulation circuit board 10. The insulation circuit board 10 is usually formed from a polyimide substrate, a glass epoxy substrate, and a ceramic substrate. A so-called chip-on-chip construction may be implemented by means of taking a semiconductor substrate as the insulation circuit board 10.

Since the present invention has been embodied in the manner as mentioned above, the invention yields the following advantages.

According to the first aspect of the present invention, ultrasonic vibration is applied to a circuit board by way of an intermediate material whose hardness is lower than that of the circuit board. Similarly, ultrasonic vibration is applied to a semiconductor substrate way of an intermediate material whose hardness is lower than that of the semiconductor substrate. There can be reliably prevented occurrence of a problem in appearance, such as generation of scratched on the surface of the circuit board or the semiconductor substrate.

According to a second aspect of the present invention, since the intermediate material is shaped like a sheet, handling of intermediate material can be facilitated.

According to a third aspect of the present invention, since the intermediate material is formed from a plurality of layers, the selective adhesiveness of the intermediate material can be controlled with a high degree of freedom.

According to a fourth aspect of the present invention, since the intermediate material is gel or liquid, supply and removal of the intermediate material can be effected readily.

According to a fifth aspect of the present invention, since the intermediate material is fixed on the second holding tool, loss that develops at the time of application of ultrasonic vibration is diminished to a sufficiently low-level. Further, there can be obviated force for peeling a semiconductor substrate from a circuit board, during the course of manufacture of a semiconductor device.

According to a sixth aspect of the present invention, since an intermediate material is fixed on the semiconductor substrate, loss that develops at the time of application of ultrasonic vibration is diminished to a sufficiently low level. New intermediate material can always be used for each semiconductor substrate.

According to a seventh aspect of the present invention, after a semiconductor substrate has been mounted on a circuit board, the intermediate material which has become undesired can be removed.

According to an eighth aspect of the present invention, glue that softens upon exposure to UV rays is used for bonding intermediate material. After a semiconductor substrate has been secured on the circuit board, the circuit board and the substrate are exposed to UV rays, thereby enabling easy removal of the intermediate material that has become undesired.

According to a ninth aspect of the present invention, since the intermediate material is gel or liquid, the intermediate material that has become undesired can be readily removed by means of cleaning.

According to a tenth aspect of the present invention, since the intermediate material is fixed on the first holding tool, loss that develops at the time of application of ultrasonic vibration is diminished to a sufficiently low level. Further, there can be obviated force for peeling a semiconductor substrate from a circuit board, during the course of manufacture of a semiconductor device.

According to an eleventh aspect of the present invention, since the intermediate material has a tape-shaped form, new material can be readily supplied to a space between the first holding tool and the insulation circuit board as well as a space between the second holding tool and the semiconductor substrate.

According to a twelfth aspect of the present invention, use of intermediate material enables an increase in the frictional resistance between the first holding tool and the circuit board as well as between the second holding tool and the semiconductor substrate. Therefore, the loss that develops at the time of application of ultrasonic vibration is diminished to a sufficiently low level.

According to a thirteenth aspect of the present invention, intermediate material has a surface with a flecked effect. Therefore, enhanced frictional resistance is developed between the intermediate material and the circuit board as well as between the intermediate material and the semiconductor substrate.

According to a fourteenth aspect of the present invention, since a resin layer is formed between the circuit board and the semiconductor substrate, there can be manufactured a highly-reliable semiconductor device.

According to a fifteenth aspect of the present invention, a semiconductor device free of problem in appearance such as scratched can be manufactured while using ultrasonic vibration for establishing electrical connection.

According to a sixteenth aspect of the present invention, there can be implemented a manufacturing apparatus which supplies tape-like material to the space between the first holding tool and the circuit board as well as to the space between the second holding tool and the semiconductor substrate, as required, and which applies ultrasonic vibration to the circuit board and the semiconductor substrate by way of intermediate material.

Further, the present invention is not limited to these embodiments, but variations and modifications may be made without departing from the scope of the present invention.

The entire disclosure of Japanese Patent Application No. 2000-375979 filed on Dec. 11, 2000 including specification, claims, drawings and summary are incorporated herein by reference in its entirety.

What is claimed is:

1. A method of manufacturing a semiconductor device having a semiconductor substrate mounted on a circuit board, the method comprising:
   a step of mounting the semiconductor substrate on the surface of the circuit board such that terminal electrodes of the circuit board oppose electrode pads of the semiconductor substrate;
   a step of establishing electrical connection between the terminal electrodes and the electrode pads, by means of applying ultrasonic vibration between a first holding tool for holding the circuit board and a second holding tool for holding the semiconductor substrate; and
   at least one of a step of interposing intermediate material between the first holding tool and the circuit board such that the intermediate material adheres to at least one of the first holding tool and the circuit board, the intermediate material having hardness lower than that of the circuit board and a step of interposing intermediate material between the second holding tool and the semiconductor substrate such that the intermediate material adheres to at least one of the second holding tool and the semiconductor substrate, the intermediate material having hardness lower than that of the semiconductor substrate.

2. The method according to claim 1, wherein the intermediate material is a sheet-like substance.

3. The method according to claim 1, wherein the intermediate material includes a first layer sheet adhering to the first or second holding tools and a second layer sheet adhering to the circuit board or the semiconductor substrate.

4. The method according to claim 1, wherein the intermediate material is a gel or liquid substance.

5. The method according to claim 1, wherein the intermediate material is interposed between the second holding tool and the semiconductor substrate and is fixed to the second holding tool.

6. The method according to claim 1, wherein the intermediate material is interposed between the second holding tool and the semiconductor substrate and is fixed to the semiconductor substrate.

7. The method according to claim 1, further comprising a step of removing the intermediate material from the first holding tool, the second holding tool, the circuit board, or the semiconductor substrate.

8. The method according to claim 7, wherein:
   the intermediate material is fixed on the first holding tool, the second holding tool, the circuit board, or the semiconductor substrate by means of glue whose adhesive force is weakened or lost when the glue is exposed to UV rays; and
   the step of removing the intermediate material includes a sub-step of radiating UV rays to the intermediate material.

9. The method according to claim 7, wherein:
   the intermediate material is a gel or liquid substance; and
   the step of removing the intermediate material includes a sub-step of cleaning the intermediate material.

10. The method according to claim 1, wherein the intermediate material is interposed between the first holding tool and the circuit board and is fixed on the first holding tool.

11. The method according to claim 1, wherein:
   the intermediate material assumes a tape-shaped form; and
   the method further comprises a step of transferring the tape-shaped intermediate material such that a new portion is supplied to a space between the first holding tool and the second holding tool while no load is imposed on the first and second holding tools.

12. The method according to claim 1, wherein:
   the intermediate material interposed between the first holding tool and the circuit board induces frictional resistance between the first holding tool and the circuit board, the resistance being greater than that developed when the first holding tool and the circuit board are in direct contact with each other; and the intermediate material interposed between the second holding tool and the semiconductor substrate induces frictional resistance between the second holding tool and the semiconductor substrate, the resistance being greater than that developed when the second holding tool and the semiconductor substrate are in direct contact with each other.

13. The method according to claim 1, wherein:

the intermediate material interposed between the first holding tool and the circuit board has a surface with a flecked effect which includes a plurality of projections and is to oppose the circuit board; and the intermediate material interposed between the second holding tool and the semiconductor substrate has a surface with a flicked effect which includes a plurality of projections and is to oppose the semiconductor substrate.

14. The method according to claim 1, further comprising a step of forming a resin layer to be filled into the circuit board and the semiconductor substrate, before or after the step of establishing electrical connection.

* * * * *